United States Patent
Hwang et al.

(10) Patent No.: US 6,562,667 B1
(45) Date of Patent: May 13, 2003

(54) TFT FOR LCD DEVICE AND FABRICATION METHOD THEREOF

(75) Inventors: Eui-Hoon Hwang, Seoul (KR); Sang-Gul Lee, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/715,188

(22) Filed: Nov. 20, 2000

(30) Foreign Application Priority Data

May 20, 1999 (KR) .............................. 99-18276

(51) Int. Cl.[7] .............................................. H01L 21/00
(52) U.S. Cl. ...................... 438/149; 438/151; 438/164; 438/166
(58) Field of Search ................................ 438/149, 151, 438/164, 166

(56) References Cited

U.S. PATENT DOCUMENTS

| | | | | |
|---|---|---|---|---|
| 5,141,885 A | * | 8/1992 | Yoshida et al. | 438/164 |
| 5,424,230 A | * | 6/1995 | Wakai | 438/164 |
| 5,508,216 A | * | 4/1996 | Inoue | 438/164 |
| 5,877,526 A | * | 3/1999 | Yamaguchi | 257/325 |
| 5,953,598 A | * | 9/1999 | Hata et al. | 438/164 |

FOREIGN PATENT DOCUMENTS

| | | |
|---|---|---|
| JP | 05203988 | 8/1993 |
| KR | 9930050 | 4/1999 |

* cited by examiner

Primary Examiner—T. N. Quach
(74) Attorney, Agent, or Firm—Birch, Stewart, Kolasch & Birch, LLP

(57) ABSTRACT

An object of the present invention is to crystallize and activate the doped amorphous semiconductor layer at the same time. It is also an object to provide the TFT with good electrical connection between the source or drain electrodes and the semiconductor layer.

The inventive method of fabricating TFT for a liquid crystal display device, includes forming a buffer layer on a substrate; forming an amorphous semiconductor layer on the whole buffer layer, the semiconductor layer having a channel region and source and drain ohmic contact regions, each positioned at opposing ends of the channel region; doping $n^+$ (or $p^+$) ions on the source and drain ohmic contact regions of the semiconductor layer while covering the channel region with a photoresist; patterning the semiconductor layer to have an island shape, the island shape including the channel region and the source and drain ohmic contact regions; irradiating laser beams on the semiconductor layer having the island shape, thereby crystallizing and activating the semiconductor layer; forming a first insulating layer on the semiconductor layer; forming a gate electrode on the first insulating layer; forming a second insulating layer on the first insulating layer while covering the gate electrode; forming source and drain contact holes penetrating both the first and second insulating layers to the source and drain ohmic contact regions of the semiconductor layer, respectively; and forming the source and drain electrodes on the second insulating layer, while the source and drain electrodes having electrical connection to the source and drain ohmic contact regions of the semiconductor layer.

3 Claims, 7 Drawing Sheets

TFT FOR LCD DEVICE AND FABRICATION METHOD THEREOF

BACKGROUND OF THE INVENTION

1. Field of the Invention

This present invention relates to a thin film transistor (TFT), and more particularly, to a thin film transistor for LCD device and the fabrication method.

2. Description of The Related Art

Fabrication method and the structure of one of top gate type TFTs according to the related art will be explained with reference to FIGS. 1a to 1g.

Referring to FIG. 1a, a buffer layer 20 is formed on a transparent substrate 10, and then an amorphous silicon(a-Si) layer 30a is deposited on the buffer layer 20 in order to form a semiconductor layer 30.

Poly-silicon(p-Si) layer 30b, shown in FIG. 1b, is made by crystallization of the amorphous silicon layer 30a. Then poly-silicon layer 30b, shown in FIG. 1c, is patterned using a conventional patterning technique. In this patterning process, a dry etching damage can occur in the semiconductor layer 30.

As shown in FIG. 1d, a gate insulating layer 40, which is made of inorganic substance such as silicon nitride($SiN_x$) and silicon oxide($SiO_x$) or organic substance such as BCB (benzoncyclobutene), is formed on the poly-silicon and buffer layers 30b and 20. Then a metal layer 50, which has a material selected from a group consisting of Molybdenum, Chrome, Aluminum, Titanium and so on, is deposited on a gate insulating layer 40.

Referring to FIG. 1e, a photoresist 60 is deposited on the whole gate layer 50, and then it is exposed to the light in order to leave a portion corresponding to a central portion of the semiconductor layer 30. Using the left photoresist, the gate insulating layer 40 and the gate layer 50 are etched and the peripheral portion of a semiconductor layer 30 is exposed. At the patterning process, the gate electrode 50 has narrower width than gate insulating layer 40 due to the difference in an etching rate and an etching time. After the etching process, a peripheral portion 30c of the semiconductor layer 30 is introduced by $n^+$(or $p^+$) ion doping (plasma doping) using the photoresist 60 as a mask. Due to the ion doping process the peripheral portion 30c of the semiconductor layer 30 is changed to the amorphous silicon. The other portions 30b of the poly-silicon layer 30 undoubtedly remains in the crystallization state.

As shown in FIG. 1f, the photoresist 60 is stripped off the gate electrode 50. For the purpose of re-crystallizing the peripheral portion 30c of the semiconductor layer 30, it is activated by activating process using laser beams. The lateral spaces "D1" and "D2", between the edge of the gate insulating layer 40 and the gate electrode 50, act as an offset area reducing a leakage current (off current) of TFT.

After re-crystallizing the doped semiconductor layer (30c in FIG. 1f), as shown in FIG. 1g, an insulating layer 70 which is made of inorganic substance such as silicon nitride ($SiN_x$) and silicon oxide ($SiO_x$) or organic substance such as BCB (benzoncyclobutene) is formed. The insulating layer 70 covers the semiconductor layer 30, the gate insulating layer 40 and the gate electrode 50. The contact holes are formed in the insulating layer 70 to expose the peripheral portion 30c of the semiconductor layer 30, and then the metallic material selected from a group consisting of Molybdenum, Chrome etc is deposited to form source and drain electrodes 80a and 80b.

As described above, the mentioned process completes the structure of TFT, which includes the semiconductor layer 30, the gate electrode 50 and the source and drain electrodes 80a and 80b.

The conventional structure of the top gate type or offset TFT, however, results in deteriorating the quality of the TFT in the re-crystallization process. Since the laser beams are irradiated on the gate electrode 50 made of a metallic material, the laser beams can hurt or degrade the gate electrode 50 when re-crystallizing the semiconductor layer 30. And in order not to degrade the quality of the gate electrode 50, if weaker activating laser beams are irradiated on the peripheral portion 30c of the semiconductor layer 30, the semiconductor layer 30 is not sufficiently re-crystallized.

SUMMARY OF THE INVENTION

It is an object of the present invention to provide a top gate type TFT which does not result in the degradation of the gate electrode even in an enough laser beams condition and the fabrication method thereof.

In accordance with the purpose of the invention, as embodied and broadly described, in one aspect the invention provides a fabricating method of a TTT for LCD including: forming a buffer layer on a substrate; forming an amorphous semiconductor layer on the whole buffer layer, the semiconductor layer having a channel region and source and drain ohmic contact regions, each positioned at opposing ends of the channel region; doping $n^+$(or $p^+$) ions on the source and drain ohmic contact regions of the semiconductor layer while covering the channel region with a photoresist; patterning the semiconductor layer to have an island shape, the island shape including the channel region and the source and drain ohmic contact regions; irradiating laser beams on the semiconductor layer having the island shape, thereby crystallizing and activating the semiconductor layer; forming a first insulating layer on the semiconductor layer; forming a gate electrode on the first insulating layer; forming a second insulating layer on the first insulating layer while covering the gate electrode; forming source and drain contact holes penetrating both the first and second insulating layers to the source and drain ohmic contact regions of the semiconductor layer, respectively; and forming the source and drain electrodes on the second insulating layer, while the source and drain electrodes having electrical connection to the source and drain ohmic contact regions of the semiconductor layer.

The process order of the patterning process and the ion doping process can be changed.

After forming the semiconductor layer and before the ion doping process a process of forming a protecting layer on the semiconductor layer can be processed. And ion doping is processed on the protecting layer. After ion doping process the protecting layer is removed.

In an another aspect of the invention, the TFT includes a substrate; a buffer layer on the substrate; a semiconductor layer having a channel region and source and drain ohmic contact regions positioning at opposing ends of the channel region; a first insulating layer on the semiconductor layer; a gate electrode on the first insulating layer; a second insulating layer on the first insulating layer while covering the gate electrode; and source and drain electrodes electrically contacting the source and drain ohmic contact regions of the semiconductor layer, respectively.

The source and drain electrodes contact the ohmic contact regions via contacting holes penetrating the first and second insulating layers.

The width of the gate electrode is, preferably, narrower than the distance of the channel region.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

For a more complete understanding of the invention and its advantages, reference is now made to the following descriptions taken in conjunction with the accompanying drawings, in which.

DETAILED DESCRIPTION OF PREFERRED EMBODIMENTS

Reference will now be made in detail to the preferred embodiment of the present invention, example of which is illustrated in the accompanying drawings.

Figure 1A:
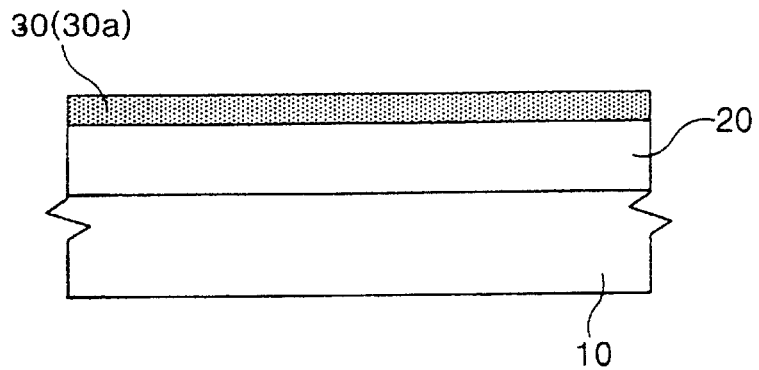
FIGS. 1a to 1g are cross sectional views illustrating fabrication process steps of a TFT according to the related art.
Figure 1B:
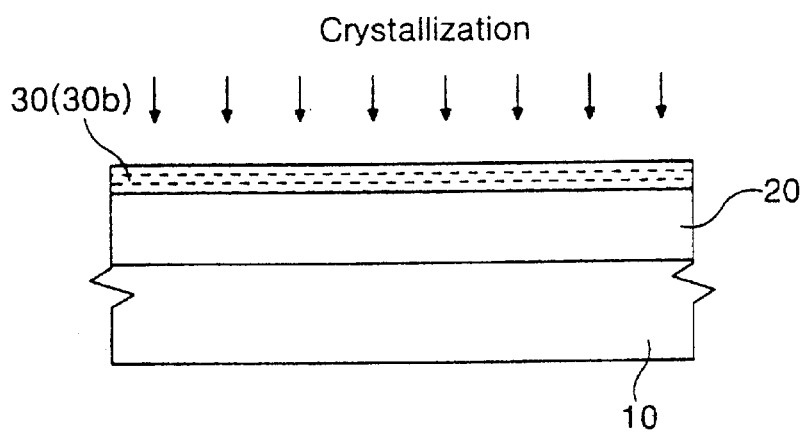
Figure 1C:
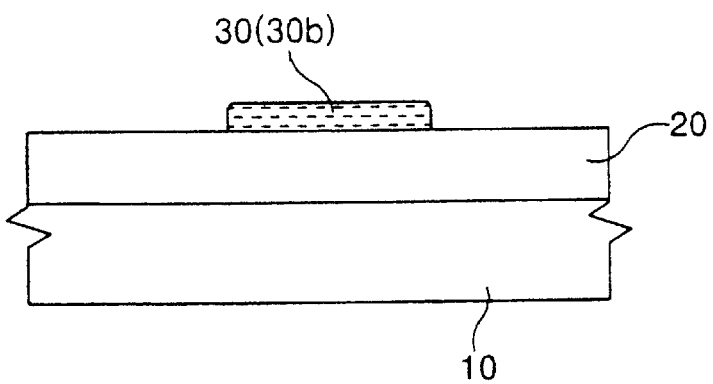
Figure 1D:
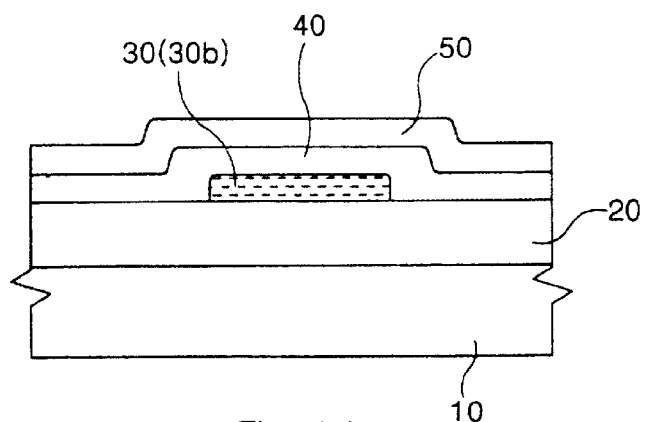
Figure 1E:
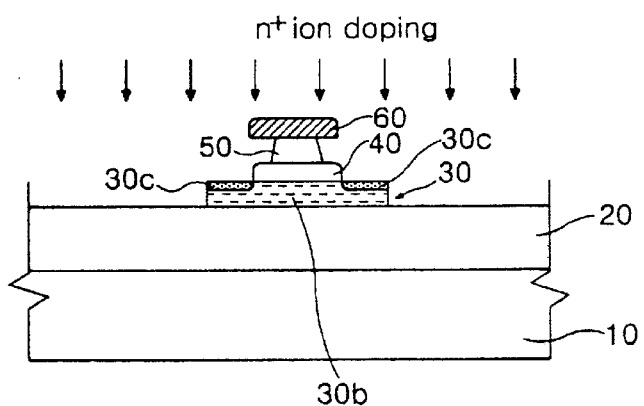
Figure 1F:
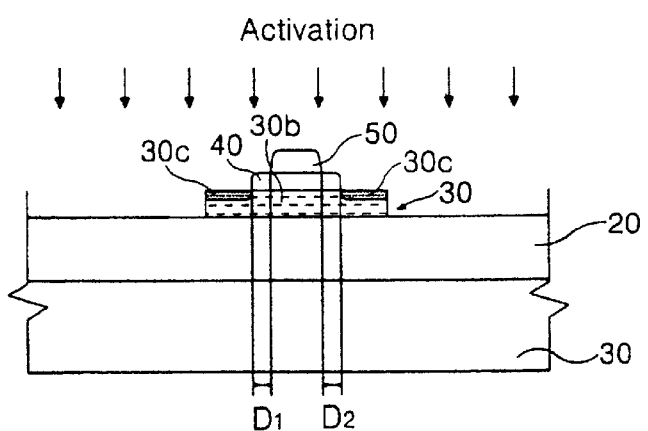
Figure 1G:
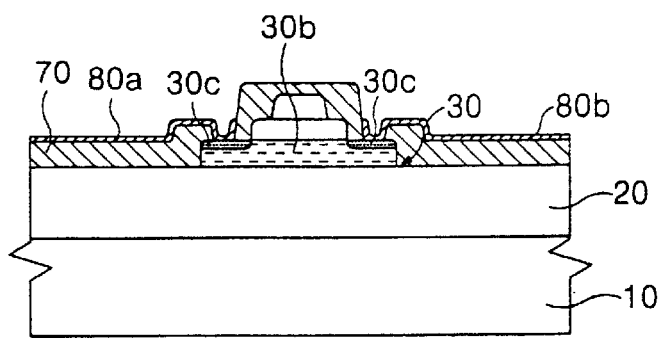
Figure 2A:
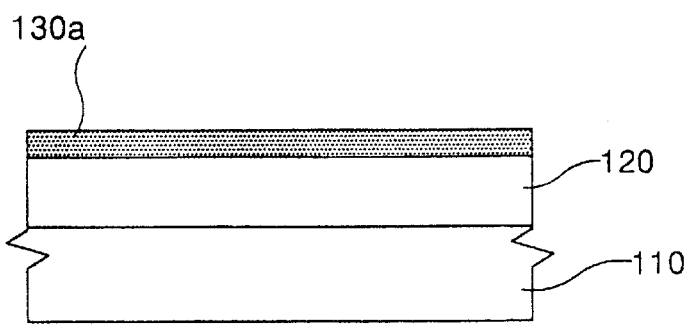
FIGS. 2a to 2e are cross sectional views illustrating fabrication process steps of a TFT according to a first embodiment of the invention.

Referring to FIG. 2a, a buffer layer 120, which is made of inorganic substance such as silicon nitride($SiN_x$) and silicon oxide($SiO_x$), is formed on a substrate 110. Then an amorphous silicon(a-Si) layer 130a is formed on the buffer layer 120.

Figure 2B:
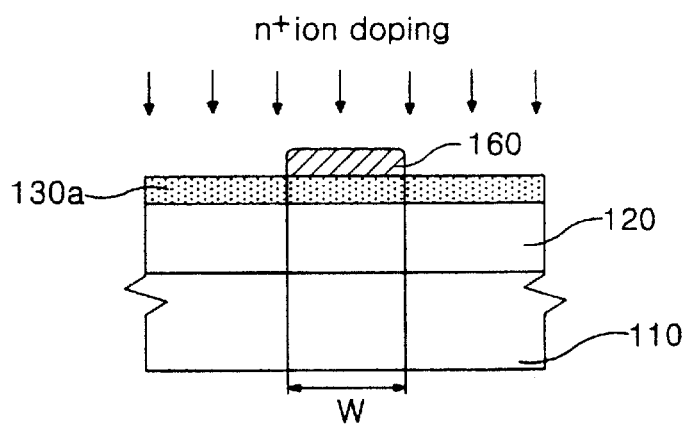

As shown in FIG. 2b, a photoresist 160 is deposited and exposed to the light to leave a portion of the photoresist 160 on the amorphous silicon layer 130a. After depositing the photoresist 160 on the amorphous silicon layer 130a, the amorphous silicon layer 130a is introduced by an $n^+$(or $p^+$) ion doping using the photoresist 160 as a mask.

Figure 2C:
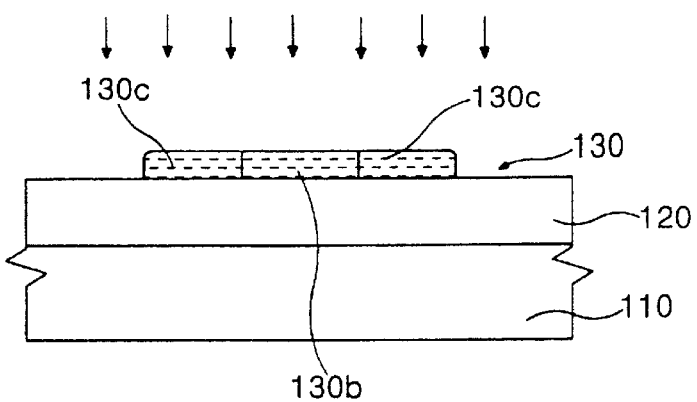

The photoresist 160 is sequentially stripped off, and then the semiconductor layer 130a is patterned to have a shape of an island. Then as shown in FIG. 2c, it is crystallized and activated by laser beams. These processes lead to forming a doped portion 130c in the peripheral region of the semiconductor layer 130a and an un-doped portion 130b in the central part of the semiconductor layer 130a. The un-doped portion or central part 130b of the semiconductor layer 130a is defined as a channel region and the opposing ends regions 130c of the channel region 130b are defined as source and drain ohmic contact regions, respectively.

Because this crystallization-activation process is preformed without any layers such as gate electrode layer on the semiconductor layer 130a, the power of laser beams can be raised until the semiconductor layer is sufficiently crystallized to become an active layer 130. Thus, the channel region 130b can be sufficiently crystallized, it can improve the characteristic of the TFT.

Figure 2D:
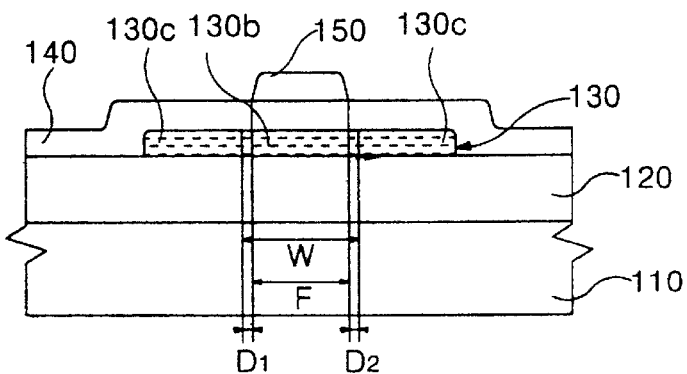

Referring to FIG. 2d, a gate insulating layer or first insulating layer 140 made of inorganic substance such as silicon nitride ($SiN_x$) and silicon oxide ($SiO_x$) or organic substance such as BCB (benzoncyclobutene) is formed on the crystallized and activated semiconductor layer 130. Then a gate electrode 150 made of metallic material selected from a group consisting of Molybdenum, Chrome, Aluminum, Titanium etc is sequentially formed on the gate insulating layer 140. The width "F" of the gate electrode is narrower than the length or distance "W" of the channel region 130b. The opposing gaps "D1" and "D2", between the length "W" of the channel region 130b and the width "F" of the gate electrode 150, act as the offset area or the LDD region which reduces the leakage current (off current) of TFT.

In this process, the lower density ions can be additionally infused to the active layer 130 using the gate electrode as a mask. The infused portion can act as an LDD region, in this case the crystallization and activation processes are not necessary, since low density ions do not significantly affect the active layer 130. If the gap spaces are not introduced with low density ions, the spaces act as an offset area, which can reduce the posssiblity of occurrence of the parasitic capacitor between the gate electrode 150 and the active layer 130. The gate electrode 150 can be made of non-metallic material such as poly-silicon containing impurities.

Figure 2E:
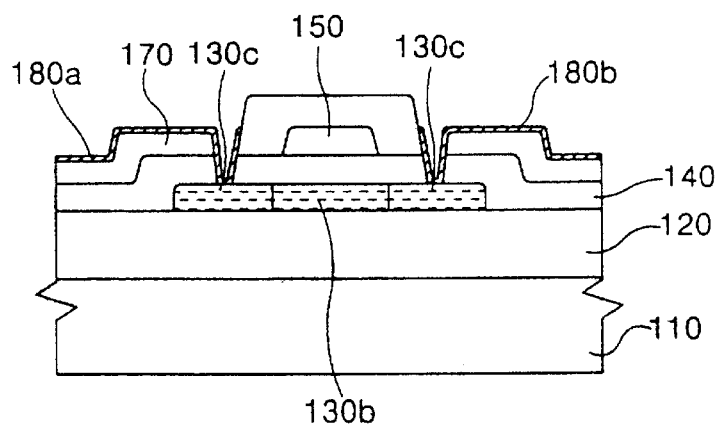

After the gate electrode 150, as shown in FIG. 2e, a second insulating layer 170 covering the gate insulating layer 140 and the gate electrode 150 is formed. The second insulating layer 170 is made of inorganic substance such as silicon nitride ($SiN_x$) and silicon oxide ($SiO_x$) or organic substance such as BCB (benzoncyclobutene). The contact holes are formed to expose the doped portion 130c of the semiconductor layer 130, and then the metallic material selected from a group consisting of Molybdenum, Chrome etc is deposited to form source and drain electrodes 180a and 180b. The contact holes penetrate the first and second insulating layers 140 and 170.

In a second embodiment, the semiconductor layer is patterned in an island shape, before it is ion-doped.

Figure 3A:
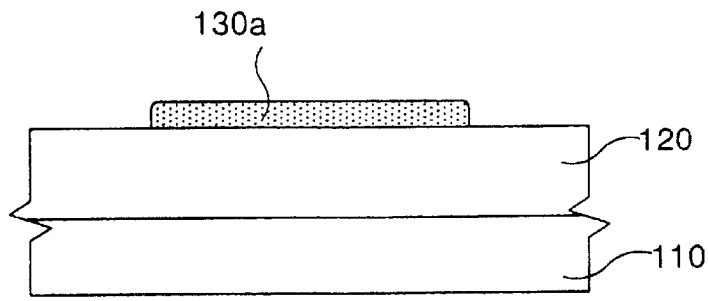
FIGS. 3a and 3b are cross sectional views illustrating fabrication process steps of a TFT according to a second embodiment of the invention.

Referring to FIG. 3a, a buffer layer 120 made of inorganic substance such as silicon nitride ($SiN_x$) and silicon oxide ($SiO_x$) is formed on a substrate 110. Then such an amorphous silicon (a-Si) layer 130a is positioned on the buffer layer 120. The amorphous silicon layer 130a is patterned in an island shape.

Figure 3B:
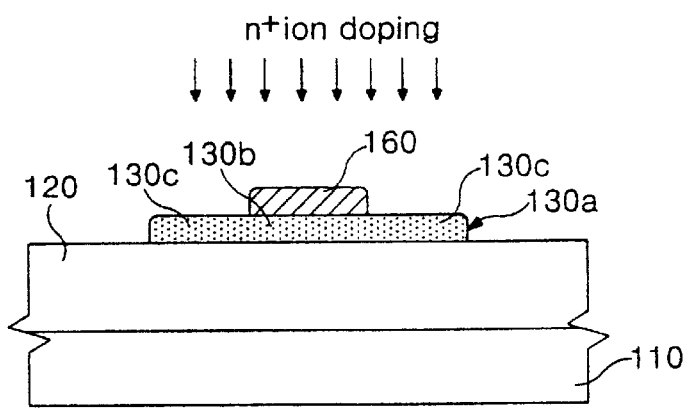

As shown in FIG. 3b, the amorphous silicon layer 130a is ion-doped using a photoresist 160 as a mask, thereby forming a channel region 130b and ohmic contact regions 130c. After the photoresist 160 is stripped off sequentially, the semiconductor layer 130 is crystallized and activated by laser beams. Since the further process steps are equal to those according to the first embodiment, shown in FIGS. 2c to 2e, the description of the later steps are omitted.

As explained above, the second embodiment has the same efficiency and functions to the first embodiment although the semiconductor layer is patterned before doping the ions on the semiconductor layer.

Meanwhile, during the doping process the semiconductor layer can be damaged by the ions. That is, the surface of the semiconductor layer can have a rough surface. The third embodiment aims to improve the surface quality of the semiconductor during the ion doping process.

Figure 4A:
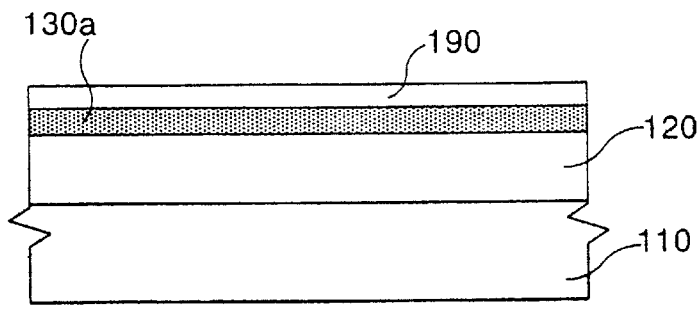
FIGS. 4a to 4e are cross sectional views illustrating fabrication process steps of a TFT according to a third embodiment of the invention.

Referring to FIG. 4a, a buffer layer 120 made of inorganic substance such as silicon nitride($SiN_x$) and silicon oxide ($SiO_x$) is formed on a substrate 110. Then an amorphous silicon (a-Si) layer 130a is positioned on the buffer layer 120. The protecting layer 190 having similar substance to the buffer layer 120 is formed on the semiconductor layer 130.

Figure 4B:
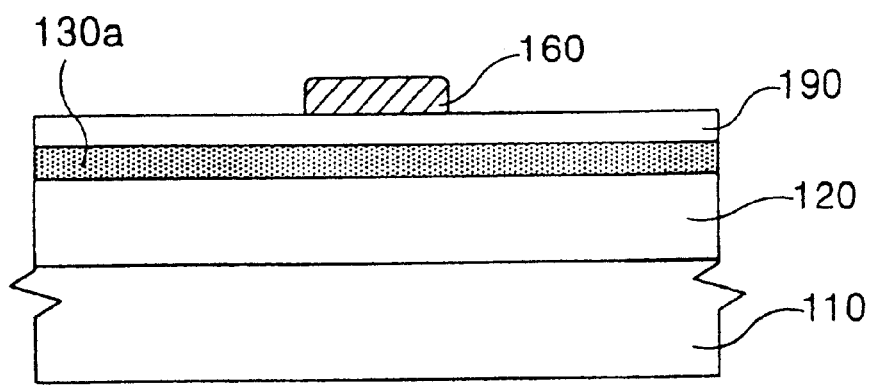

On the protecting layer 190, as shown in FIG. 4b, the photoresist 160 having an area corresponding to the channel region of the semiconductor layer 130a is formed.

Figure 4C:
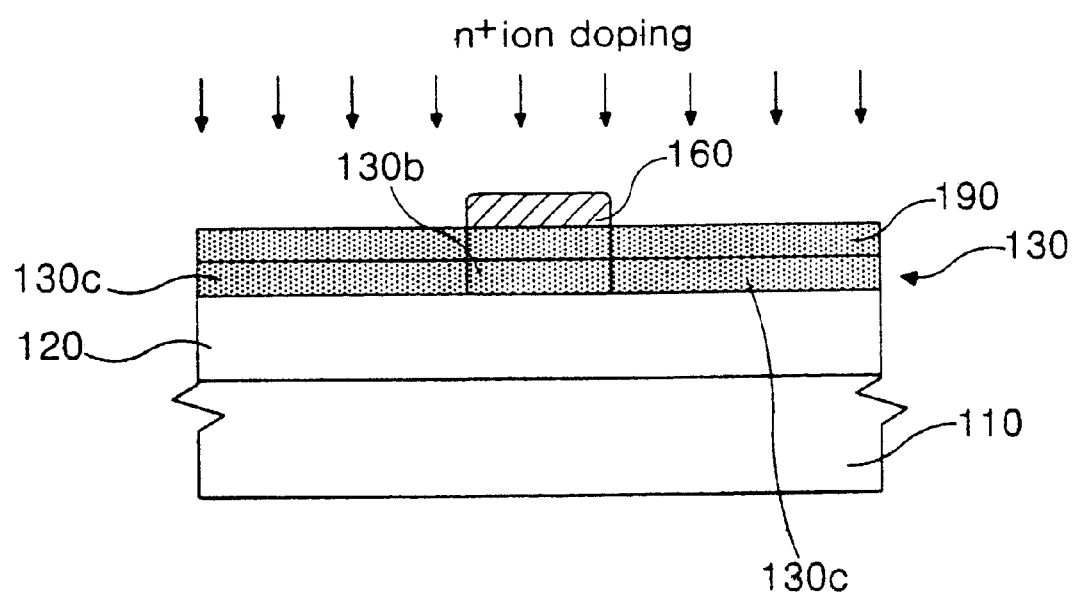

As shown in FIG. 4c, the peripheral portion 130c of the semiconductor layer 130a is doped by such an n$^+$(or P$^+$) ion (plasma) using the photoresist 160 as a mask. Therefore, the central portion 130b of the semiconductor layer 130 is un-doped by the ions and the peripheral portion 130c of the semiconductor layer 130 is doped.

Since the semiconductor layer 130 is doped using the protecting layer 190, it is prevented from surface damages compared to a directly doped semiconductor layer.

Figure 4D:
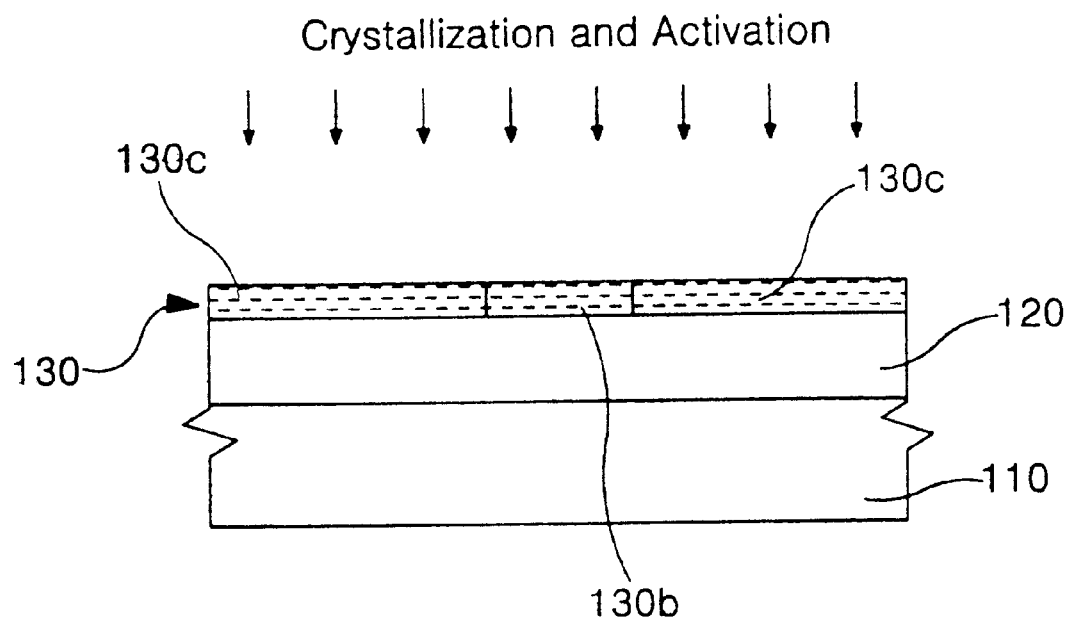

As shown in FIG. 4d, the semiconductor layer 130a is crystallized and activated by laser beams after the photoresist 160 and the protecting layer 190 are sequentially stripped off to become an active layer 130. In this embodiment, because this crystallization-activation process is preformed without any layers such a gate electrode layer on the semiconductor layer 130, the power of laser beams can be raised like the first and second embodiments until the semiconductor layer 130 is sufficiently crystallized.

Figure 4E:
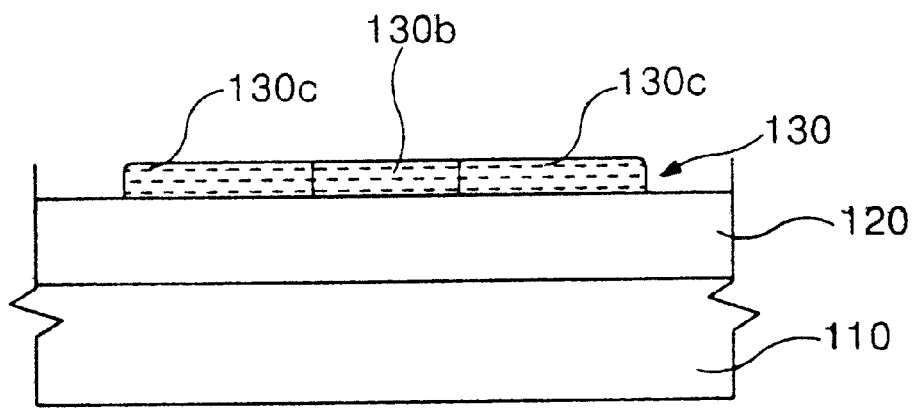

After that, shown in FIG. 4e, the crystallized and activated semiconductor layer 130 is patterned in the shape of island. Moreover, the semiconductor layer 130 can be patterned in the shape of island before being crystallized and activated, as discussed in the second embodiment.

Since the further process steps are equal to the first and second embodiments, shown in FIGS. 2c to 2e, the description of the later steps are omitted.

Although preferred embodiments and advantages thereof have been described heretofore, variations and changes are possible by the skilled in the art without departing from the spirit and scope of the invention, which will be indicated by the following Claims.

What is claimed is:

1. A method of fabricating TFT for a liquid crystal display device, comprising:

forming a buffer layer on a substrate;

forming an amorphous semiconductor layer on the whole buffer layer, the amorphous semiconductor layer having a channel region and source and drain ohmic contact regions each positioned at opposing ends of the channel region;

forming a protecting layer on the entire surface of the amorphous semiconductor layer;

doping n$^+$ (or p$^+$) ions on the source and drain ohmic contact regions of the amorphous semiconductor layer while covering the channel region with a photoresist and while covering the entire surface of the amorphous semiconductor layer with said protecting layer;

removing the protecting layer;

patterning the amorphous semiconductor layer to have an island shape, the island shape including the channel region and the source and drain ohmic contact regions;

irradiating laser beams on the amorphous semiconductor layer having the island shape, thereby simultaneously crystallizing and activating the amorphous semiconductor layer so as to have a polycrystalline structure;

forming a first insulating layer on the substrate to cover the polycrystalline semiconductor layer;

forming a gate electrode on the first insulating layer and over the channel region;

forming a second insulating layer on the first insulating layer so as to cover the gate electrode;

forming source and drain contact holes penetrating both the first and second insulating layers, the source and drain contact holes exposing the source and drain ohmic contact regions of the polycrystalline semiconductor layer, respectively; and forming the source and drain electrodes on the second insulating layer, the source and drain electrodes having electrical connection to the source and drain ohmic contact regions of the polycrystalline semiconductor layer, respectively.

2. The method of claim 1, wherein a width of the gate electrode is substantially smaller than a length of the channel region so as to form gaps between the end of the channel region and the end of the gate electrode.

3. The method of claim 2, wherein the gaps act as offset areas.

* * * * *